United States Patent
Ganchrow et al.

(10) Patent No.: US 10,347,967 B2
(45) Date of Patent: Jul. 9, 2019

(54) SIGNAL DELIVERY AND ANTENNA LAYOUT USING FLEXIBLE PRINTED CIRCUIT BOARD (PCB)

(71) Applicant: QUALCOMM Incorporated, San Diego, CA (US)

(72) Inventors: Elimelech Ganchrow, Zikhron Ya'akov (IL); Alon Yehezkely, Haifa (IL)

(73) Assignee: QUALCOMM Incorporated, San Diego, CA (US)

(*) Notice: Subject to any disclaimer, the term of this patent is extended or adjusted under 35 U.S.C. 154(b) by 12 days.

(21) Appl. No.: 15/415,145

(22) Filed: Jan. 25, 2017

(65) Prior Publication Data

US 2017/0214121 A1 Jul. 27, 2017

Related U.S. Application Data

(60) Provisional application No. 62/287,412, filed on Jan. 26, 2016.

(51) Int. Cl.
| | | |
|---|---|---|
| *H01Q 1/38* | (2006.01) | |
| *H01Q 1/22* | (2006.01) | |
| *H04B 7/02* | (2018.01) | |
| *G06F 3/00* | (2006.01) | |
| *H01Q 1/24* | (2006.01) | |
| *H01Q 9/28* | (2006.01) | |

(52) U.S. Cl.
CPC ........... *H01Q 1/2291* (2013.01); *G06F 3/005* (2013.01); *H01Q 1/22* (2013.01); *H01Q 1/2258* (2013.01); *H01Q 1/2266* (2013.01); *H01Q 1/243* (2013.01); *H01Q 1/38* (2013.01); *H04B 7/02* (2013.01); *H01Q 9/285* (2013.01)

(58) Field of Classification Search
CPC .......... H01Q 1/2291; H01Q 1/38; H01Q 1/22; H01Q 9/285; H04B 7/02; G06F 3/005
USPC ........................................... 343/702, 700 MS
See application file for complete search history.

(56) References Cited

U.S. PATENT DOCUMENTS

| | | | |
|---|---|---|---|
| 2010/0033393 A1 | 2/2010 | Myszne et al. | |
| 2011/0312382 A1 | 12/2011 | Itay et al. | |
| 2012/0009983 A1* | 1/2012 | Mow ...................... | H01Q 1/243 455/575.7 |
| 2012/0235848 A1* | 9/2012 | Bruno ...................... | G01S 7/36 342/16 |
| 2012/0307695 A1* | 12/2012 | Yehezkely ................ | H01P 5/20 370/310 |
| 2012/0309331 A1* | 12/2012 | Yehezkely ........... | H04B 7/0689 455/101 |
| 2014/0225806 A1 | 8/2014 | Lee et al. | |

OTHER PUBLICATIONS

International Search Report and Written Opinion—PCT/US2017/015123—ISA/EPO—dated May 11, 2017.

\* cited by examiner

*Primary Examiner* — Hai V Tran
(74) *Attorney, Agent, or Firm* — Patterson & Sheridan, L.L.P.

(57) ABSTRACT

Certain aspects of the present disclosure relate to methods and apparatus for wireless communication, and more particularly, to using a flexible printed circuit board (PCB) to convey signals between a radio frequency (RF) module and a baseband module. The flexible PCB can then be used as a medium for deploying antennas or creating arrays of multiple RF modules.

30 Claims, 10 Drawing Sheets

SIGNAL DELIVERY AND ANTENNA LAYOUT USING FLEXIBLE PRINTED CIRCUIT BOARD (PCB)

CLAIM OF PRIORITY UNDER 35 U.S.C. § 119

The present application claims the benefit of U.S. Provisional Patent Application Ser. No. 62/287,412, entitled "SIGNAL DELIVERY AND ANTENNA LAYOUT USING FLEXIBLE PCB" and filed Jan. 26, 2016, which is assigned to the assignee of the present application and hereby expressly incorporated by reference herein in its entirety.

FIELD

The present disclosure relates generally to wireless communication, and more particularly, to methods and apparatus for conveying signals in an RF system.

BACKGROUND

The 60 GHz band is an unlicensed band which features a large amount of bandwidth and a large worldwide overlap. The large bandwidth means that a very high volume of information can be transmitted wirelessly. As a result, multiple applications, that require transmission of a large amount of data, can be developed to allow wireless communication around the 60 GHz band. Examples for such applications include, but are not limited to, wireless high definition TV (HDTV), wireless docking stations, wireless Gigabit Ethernet, and many others.

In order to facilitate such applications there is a need to develop integrated circuits (ICs), such as amplifiers, mixers, radio frequency (RF) analog circuits, and active antennas that operate in the 60 GHz frequency range. An RF system typically comprises active and passive modules. The active modules (e.g., a phase-array antenna) require, control and power signals for their operation, which are not required by passive modules (e.g., filters). The various modules are fabricated and packaged as RFICs that can be assembled on a printed circuit board (PCB). The size of the RFIC package may range from several to a few hundred square millimeters.

In the market of consumer electronics, the design of electronic devices, and thus RF modules integrated therein, should meet the constraints of minimum cost, size, and weight. The design of the RF modules should also take into consideration the current assembly of electronic devices, and particularly handheld devices, such as laptop and tablet computers in order to enable efficient transmission and reception of millimeter wave signals.

SUMMARY

Certain aspects of the present disclosure provide an apparatus for wireless communications. The apparatus generally includes one or more antennas, at least one radio frequency (RF) module coupled to the one or more antennas, a baseband module, and a flexible printed circuit board (PCB) coupled between the RF module and the baseband module, the one or more antennas being disposed on the flexible PCB.

Certain aspects of the present disclosure provide an apparatus for wireless communication. The apparatus generally includes one or more antennas, a baseband module, and a flexible PCB coupled to the baseband module, the one or more antennas being disposed on the flexible PCB.

Certain aspects of the present disclosure provide an apparatus for wireless communication. The apparatus generally includes one or more antennas, at least one RF module coupled to the one or more antennas, and a flexible PCB coupled to the RF module, the one or more antennas being disposed on the flexible PCB.

Certain aspects of the present disclosure provide a method for wireless communication. The method generally includes generating, at a baseband module, one or more signals; providing the one or more signals to a RF module via a flexible PCB; and generating, at the RF module, an RF signal for transmission via one or more antennas based on the one or more signals, the one or more antennas being disposed on the flexible PCB.

Certain aspects of the present disclosure provide a method for wireless communication. The method generally includes generating, at a RF module, one or more signals based on a RF signal received via one or more antennas; providing the one or more signals to a baseband module via a flexible PCB, the one or more antenna being disposed on the flexible PCB; and processing the one or more antennas at the baseband module.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
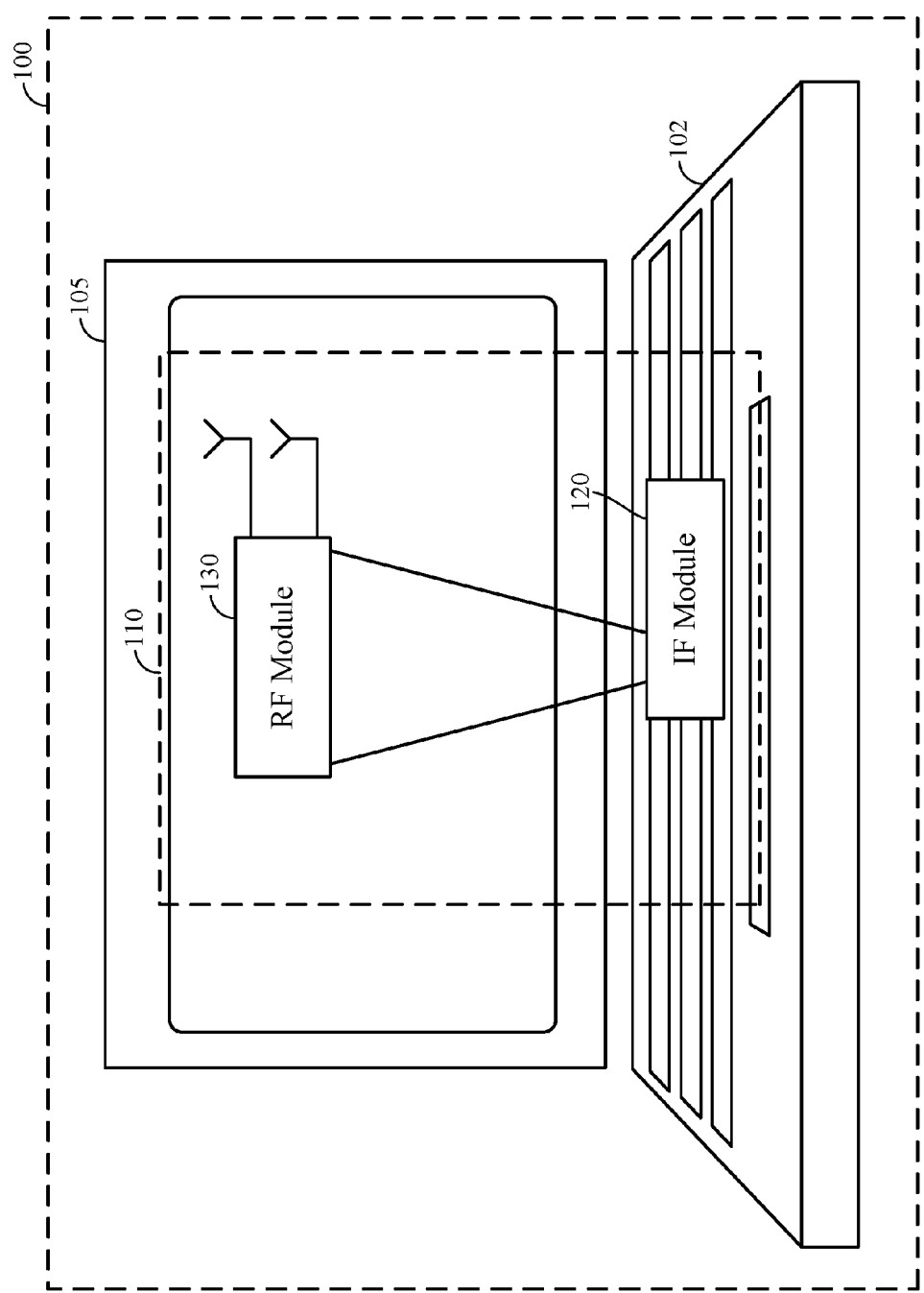
FIG. 1 illustrates an example laptop computer having radio transmission capabilities.

Certain aspects of the present disclosure enable connectivity of one more RF modules to a baseband module using a flexible printed circuit board (PCB). In some cases, transmission lines for direct-current (DC) power and/or sensor signals may be included in the flexible PCB. In some cases, antennas may be incorporated in the flexible PCB.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of radio frequency (RF) communication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software/firmware, middleware, microcode, hardware description language, or otherwise.

Accordingly, in one or more exemplary aspects, the functions described may be implemented in hardware, software, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, PCM (phase change memory), flash memory, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

FIG. 1 illustrates an example laptop computer 100 that includes an RF system 110 for transmission and reception of signals. The form factor of the RF system 110 is spread between the base 102 and lid planes 105 of the laptop computer 100.

The RF system 110 includes two parts: a baseband module 120 and RF module 130 respectively connected to the base plane 102 and lid plane 105. The RF module 130 includes active transmit (TX) and receive (RX) antennas. When transmitting signals, the baseband module 120 may provide the RF module 130 with control, local oscillator (LO), intermediate frequency (IF), and power (direct-current (DC)) signals. The control signal may be used for functions, such as gain control, RX/TX switching, power level control, sensors, and detectors readouts. Specifically, beam-forming based RF systems require high frequency beam steering operations which are performed under the control of the baseband module 120. The control typically originates at the baseband 120 of the system, and transfers between the baseband module 120 and RF module 130.

The RF module 130 typically performs up-conversion, using a mixer (not shown) on the IF signal(s) to RF signals and then transmits the RF signals through the TX antenna according to the control of the control signals. The power signals are DC voltage signals that power the various components of the RF module 130.

In the receive direction, the RF module 130 receives RF signals at the frequency band of 60 GHz, through the active RX antenna and performs down-conversion, using a mixer, to IF signals using the LO signals, and sends the IF signals to baseband module 120. The operation of the RF module 130 is controlled by the control signal, but certain control information (e.g., feedback signal) is sent back to the baseband module 120.

Current solutions typically use at least two cables (transmission lines) to transfer the IF, LO, power, and control signals between the baseband and RF modules 120 and 130.

This drawback is critical in millimeter-wave RF systems, e.g., systems that operate in the 60 GHz frequency bands, as the RF module 130 may be required to be located close to the active antennas to perform the functions described above in order to minimize the power loss of the received and transmit signals. Thus, the baseband module 120 is located apart from the RF module 130. Further, because transferring high frequency signals over the cables may significantly attenuate the signals, cables that provide low attenuation characteristics may be used. However, such cables are relativity expensive, thus increasing the bill of material (BoM) of consumer electronics devices.

It would be therefore advantageous to provide a solution for connecting, using a single cable (transmission line), radio frequency modules in an electronic device for use in at least the 60 GHz frequency band.

Figure 2:
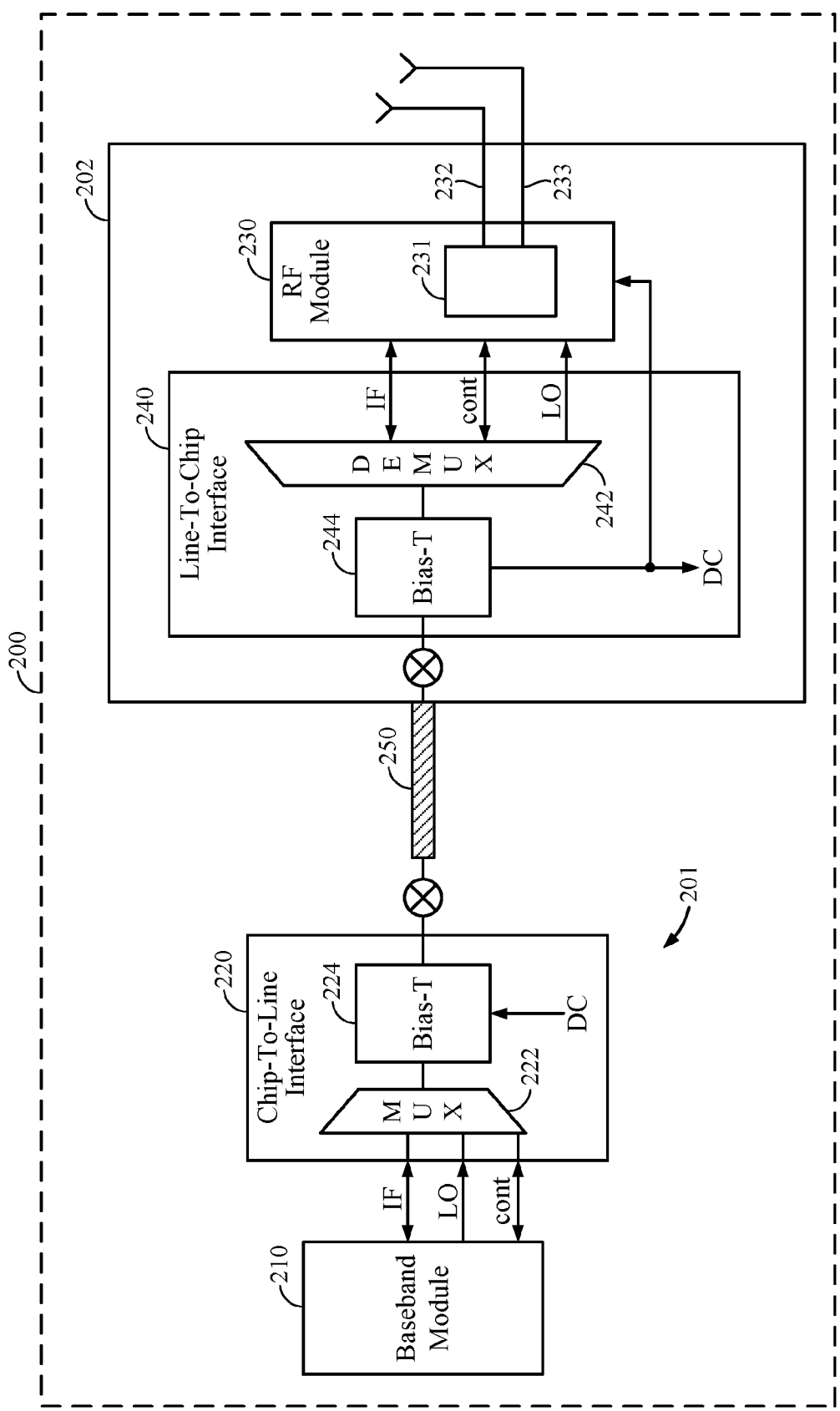
FIG. 2 illustrates an example RF system, in accordance with certain aspects of the present disclosure.

FIG. 2 illustrates an example RF system 200 used to describe various aspects of the present disclosure. The RF system 200 includes a baseband module 210 coupled to a chip-to-line interface module 220. In addition, the RF system 200 includes an RF module 230 coupled to a line-to-chip interface unit 240. The RF module 230 comprises RF circuitry 231 to perform up- and down-conversions of radio signals and to control the TX and RX active antennas 232 and 233. In an aspect of the present disclosure, each of the antennas 232 and 233 is a phase array antenna. The RF system 200 enables the efficient transmission and reception of signals in at least the 60 GHz band.

The baseband module 210 and RF module 230 are apart from each other and are connected using a single transmission line 250 through the interfaces 220 and 240. In one aspect, the baseband and RF modules 210 and 230 are respectively located at the base and lid planes of a laptop computer. One of ordinary skill should appreciate that a connection between these planes is using, for example, a cable. Placing the baseband and RF modules 210 and 230 apart from each is required to locate the active antennas at such a location where optional reception/transmission of signals may be achieved. Such a location is typically not in proximity to the baseband module which is usually placed by the device's fan/ventilation. As another example, at a tablet computer, the baseband and RF modules 210 and 230 are located at opposite ends of the tablet.

At least four different signals are simultaneously transferred over the transmission line 250 including, but not limited to, power, control, intermediate frequency (IF), and local oscillator source (LO). It should be noted that the IF and control signals are transferred over the line 250 in both directions. The control signal controls, at least, the switching of the TX and RX active antennas, the direction of the antenna (beam forming), and gain control. The LO signals are required to synchronize the two modules and to perform up and down-conversions of high frequency signals.

Each signal transferred over the transmission line 250 has a different frequency band. In certain aspects of the present disclosure, a frequency plan is disclosed that enables the efficient transfer of the five signals over the transmission line 250. In accordance with certain aspects of the present disclosure, the transmission line 250 is a standard micro coaxial cable. In this aspect, the connection between the PCB and the micro coaxial cable is using a micro connector. According to another aspect, the transmission line 250 can be formed by fabricating a metal line on a multilayer substructure.

During the simultaneous transfer of the LO, IF, control, and power signals over the transmission line 250, the interface units 220 and 240 are used. The interface units 220 and 240 multiplex the various signals and impedance matches between the transmission line 250 and the PCBs to which the modules 210 and 230 are connected to.

As shown in FIG. 2, the chip-to-line interface unit 220 includes a multiplexer 222 and a Bias-T unit 224, and the line-to-chip interface unit 240 includes a demultiplexer 242 and a Bias-T unit 244. The multiplexer 222 multiplexes the IF signal, LO signal, and control signal to be output on a single output provided to the input of the Bias-T unit 224. The Bias-T unit 224 adds a DC voltage signal from a power source and outputs the signal to the transmission line 250. The multiplexer 222 also performs a demultiplexing operation to produce the IF signal(s) and control signal transferred from the RF module 230.

The demultiplexer 242 de-multiplexes the input received on the transmission line 250, to generate the control signal, IF signal, and LO signal. Prior to that, the Bias-T unit 244 extracts the DC voltage signal to power the RF module 230. It should be noted that the DC voltage signal is always provided to the RF module 230 to enable proper operation. The demultiplexer 242 also performs a multiplexing operation on the IF signal (results of a down-conversion of the received RF signals) and control signal to be transferred to the baseband module 210.

In certain aspects, the multiplexer 222 and Bias-T unit 224 are integrated in the baseband module 210 which are embedded in an RFIC. In the same fashion, the demultiplexer 242 and Bias-T unit 244 are integrated in the RF module 230, which is fabricated as an RFIC. In another aspect, the multiplexer 222 and demultiplexer 242 are part of the baseband and RF modules respectively, thus are part of RFICs. The Bias-T units 224 and 244, on the other hand, are part of PCBs 201 and 202, thus the DC signal multiplexing/demultiplexing is performed over the PCBs.

In certain aspects of the present disclosure, the source of the LO signal is at the RF module 230. Accordingly, the LO signal is multiplexed with the received IF signal and transferred to the baseband module 210 over the transmission line 250.

In certain aspects of the present disclosure, the baseband module 210 and RF module 230 are fabricated on different substrates and connected using a transmission line (e.g., a cable). According to certain aspects of the present disclosure, the RF and baseband modules are fabricated on the same substrate and are connected using a coaxial cable. In this aspect, the techniques disclosed herein for multiplexing the signals are also applied.

As noted above, rather than a single transmission line, in some cases, different transmission lines may be used (e.g., for IF, LO and/or control signals). The transmission lines may be routed via a coaxial cable, or as described below, in a flexible PCB.

Figure 3:
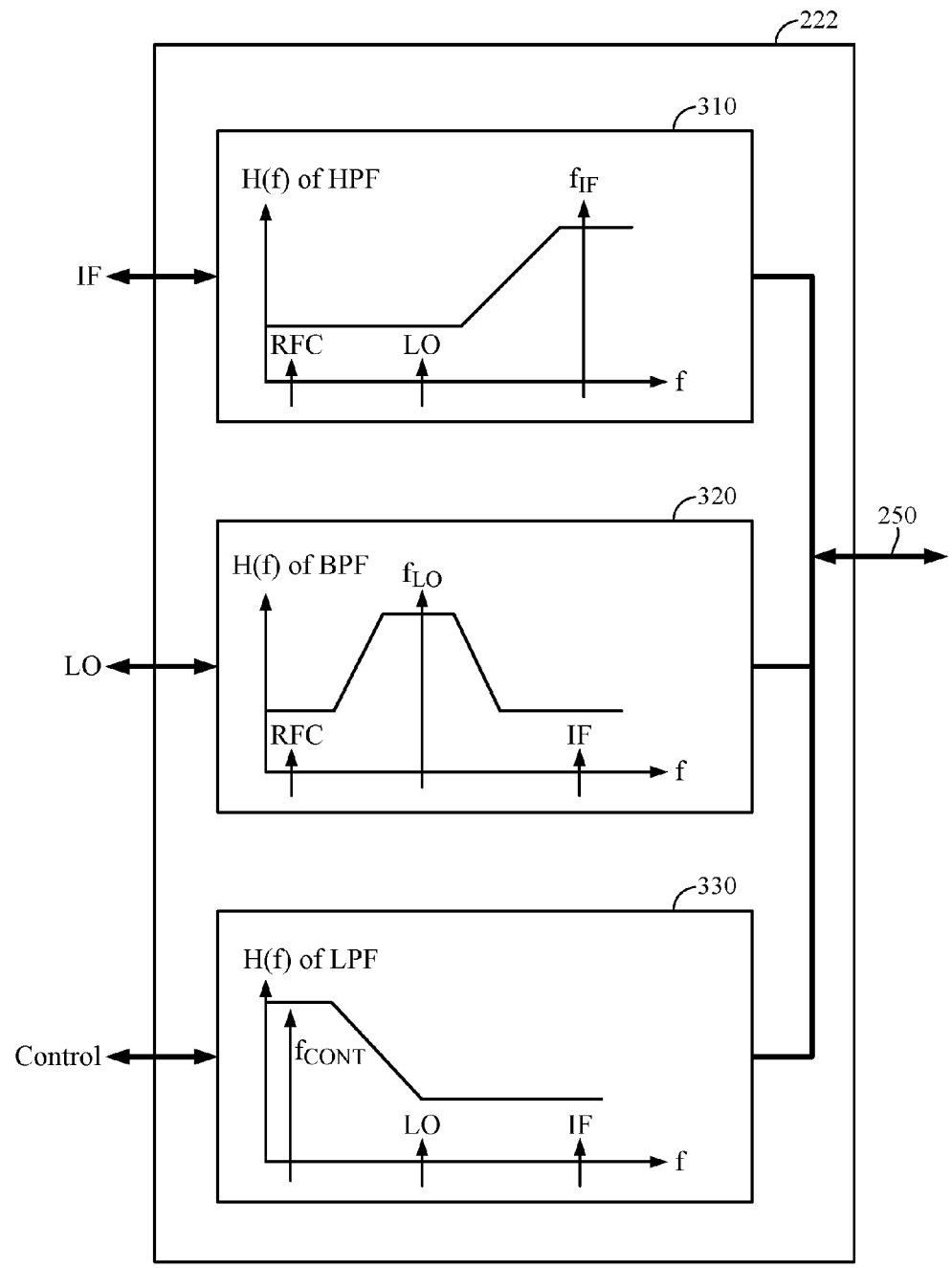
FIG. 3 illustrates an example multiplexer, in accordance with certain aspects of the present disclosure.

FIG. 3 shows a non-limiting block diagram of the multiplexer 222 constructed in accordance with certain aspects of the present disclosure. The multiplexer 222 separates the frequency spectrum to three different frequency bands: $f_{IF}$, $f_{LO}$, and $f_{CTRL}$ to multiplex the LO signal, IF signal, and control signal in these bands respectively. Specifically, the multiplexer 222 includes a high-pass filter (HPF) 310, a band-pass filter (BPF) 320, and a low-pass filter (LPF) 330; each passes signals in the $f_{IF}$, $f_{LO}$, and $f_{CTRL}$ bands respectively.

Example Signal Delivery and Antenna Layout Using Flexible PCB

As described above, with reference to FIG. 2, in some implementations, a wireless device may use separate radio frequency (RF) modules and separate baseband modules connected via one or more transmission lines 250. For example, a 60 GHz WiFi solution can include two separate chips and system in packages (SiPs) for antenna arrays. The RF modules may be located near/with antennas (or antenna arrays), for example, at a radiation point, while the baseband module may be located near an application processor.

The connection between the two packages presents a design challenge, as a variety of signals travel between the packages. These signals may include a power signal (e.g., a direct-current (DC) power signal), a local oscillator (LO) signal, intermediate frequency (IF) transmit/receive signals, RF controller signals, and sensor outputs.

In certain implementation, a bias-T circuit and a multiplexer integrated in a single chip generate a multiplexed signal having the power, IF, LO and control signals. The Bias-T adds the power signal to the combined IF, LO, and control signals, as described with respect to FIG. 2. In some cases, combined signals are transmitted (between RF and baseband modules) over a coaxial cable. As the IF signal is operating at 18 GHz, for example, and the coax cable is relatively thin for placement concerns, the coaxial cable may have a very thin center conductor. Unfortunately, the thin center conductor may cause a voltage drop when providing the power signal the RF module.

Certain aspects of the present disclosure provide an efficient solution that may allow at least one of the IF, LO, control, and power signals to be transmitted using a flexible printed circuit board (PCB). As space is a premium (particularly in the mobile space), in some cases, the flexible PCB may also be used as a medium for deploying antennas.

As used herein, a flexible PCB generally refers to a printed circuit that is flexible (e.g., bendable), rather than rigid, and may allow for coupling of circuit components. For example, a flexible PCB may be made of flexible materials, such as a flexible plastic substrate. A flexible PCB may also be referred to as a flexible printed circuit (FPC), flexible circuit, or flex circuit. For certain aspects, one or more portions of the flexible PCB may be rigid, but at least some portion of the flexible PCB is bendable.

Figure 4:
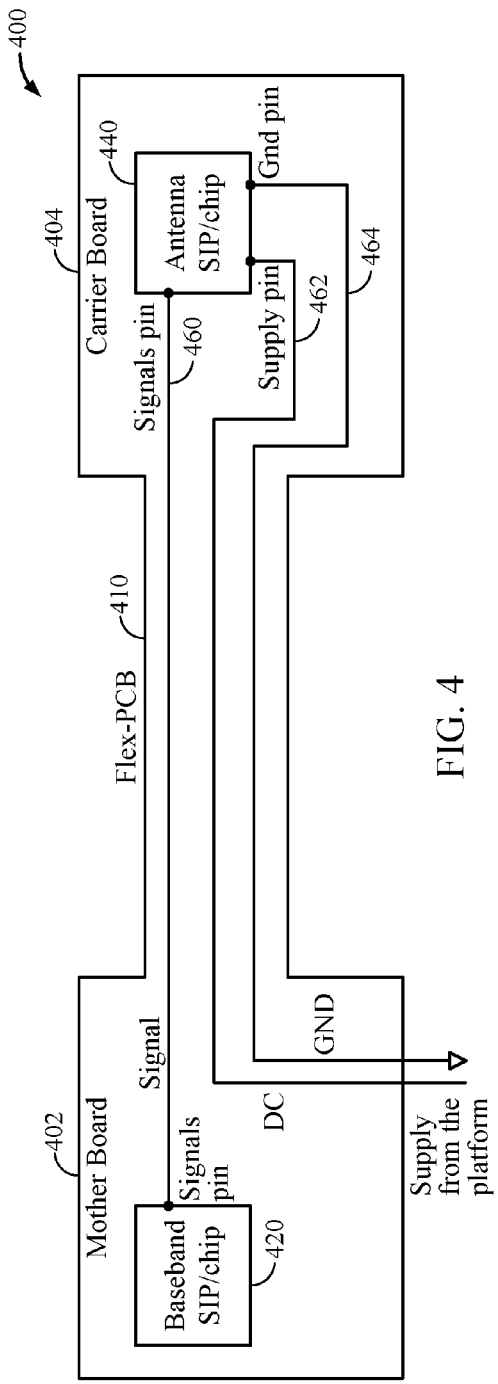
FIG. 4 illustrates an example RF system using a flexible printed circuit board (PCB), in accordance with certain aspects of the present disclosure.

FIG. 4 illustrates an example RF system 400 using a flexible PCB 410, in accordance with certain aspects of the present disclosure. The RF system 400 includes a mother board 402 (e.g., PCB) and a carrier board 404 (e.g., PCB) having a baseband module 420 and an RF module 440, respectively. Signals may be conveyed between the mother board 402 and the carrier board 404 using a flexible PCB 410. For example, the flexible PCB 410 may be used to route signals such as a power signal, an LO signal, an IF signal, and/or a control signal between the baseband module 420 and the RF module 440.

In certain aspects, the flexible PCB 410 may include a transmission line 460 for conveying a multiplexed signal having at least one of the LO signal, the IF signal, and the control signal. In some cases, the flexible PCB may also include a separate transmission line 462 for providing the power signal to the RF module. By having a separate conductor (e.g., a trace) for the power signal, the transmission line 462 for providing the power signal can be widened, lowering the voltage drop across the transmission line. In certain aspects, a transmission line 464 may be used to provide a reference potential (e.g., electrical ground) to the RF module 440.

Figure 5:
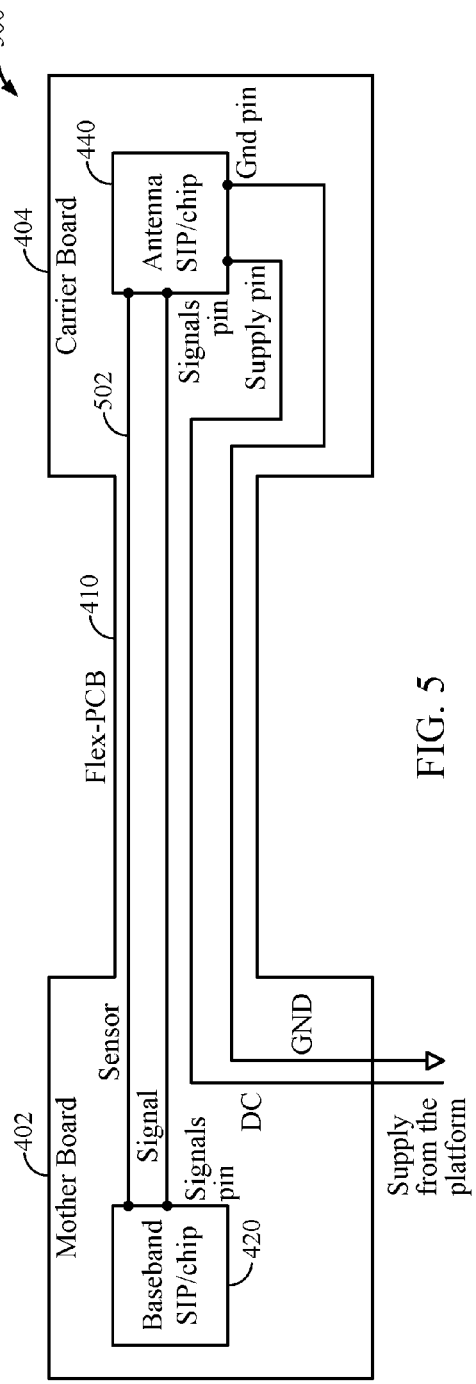
FIG. 5 illustrates an example RF system using a flexible PCB that conveys sensor information, in accordance with certain aspects of the present disclosure.

FIG. 5 illustrates an example RF system 500 using a flexible PCB 410 including a transmission line for sensor signals, in accordance with certain aspects of the present disclosure. For example, the flexible PCB 410 may also include a transmission line 502 for providing sensor signals such that the sensor signals do not interfere with the power signal. In some cases, the sensor signal may include information regarding proximity of objects which may be used by the RF module 440 to determine a configuration for communicating signals.

Figure 6:
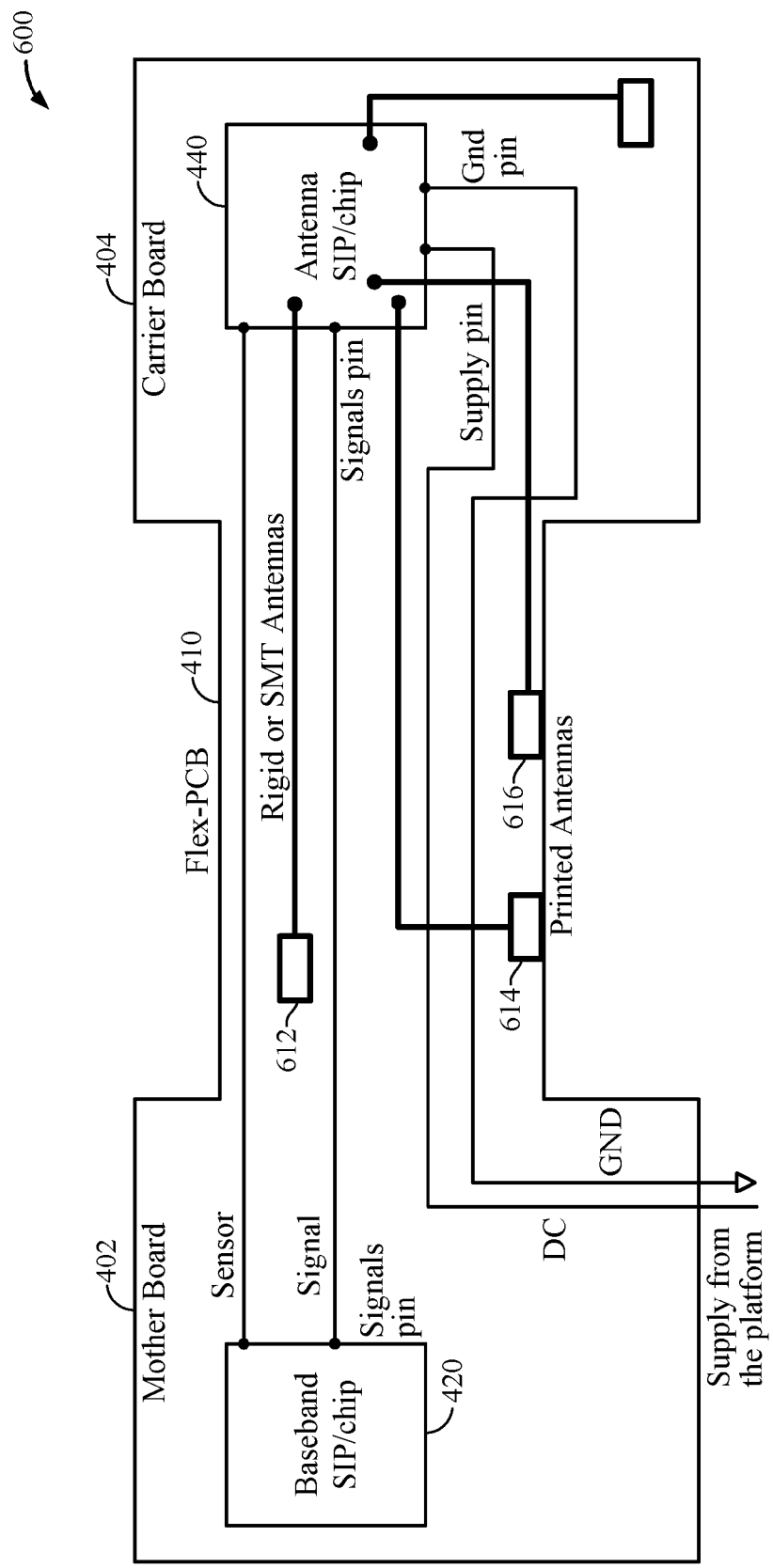
FIG. 6 illustrates an example RF system using a flexible PCB incorporating antennas, in accordance with certain aspects of the present disclosure.

FIG. 6 illustrates an example RF system 600 having antennas implemented with a flexible PCB 410, in accordance with certain aspects of the present disclosure. That is, by providing the DC, LO, IF, and/or control signals via a flexible PCB 410, there can also be a deployment of antennas along the flexible PCB's length for improved radiation per space usage. For example, in certain aspects, an antenna 612 may be printed on a localized rigid section of the flexible PCB. In certain aspects, the antenna 612 may have a surface mount technology (SMT) form factor. In certain aspects, one or more antennas 614 and 616 may be printed on the flexible PCB, as illustrated. Depending on the thickness and number of layers of the flexible PCB, different radiating element types may be preferred.

Figures 7, 8:
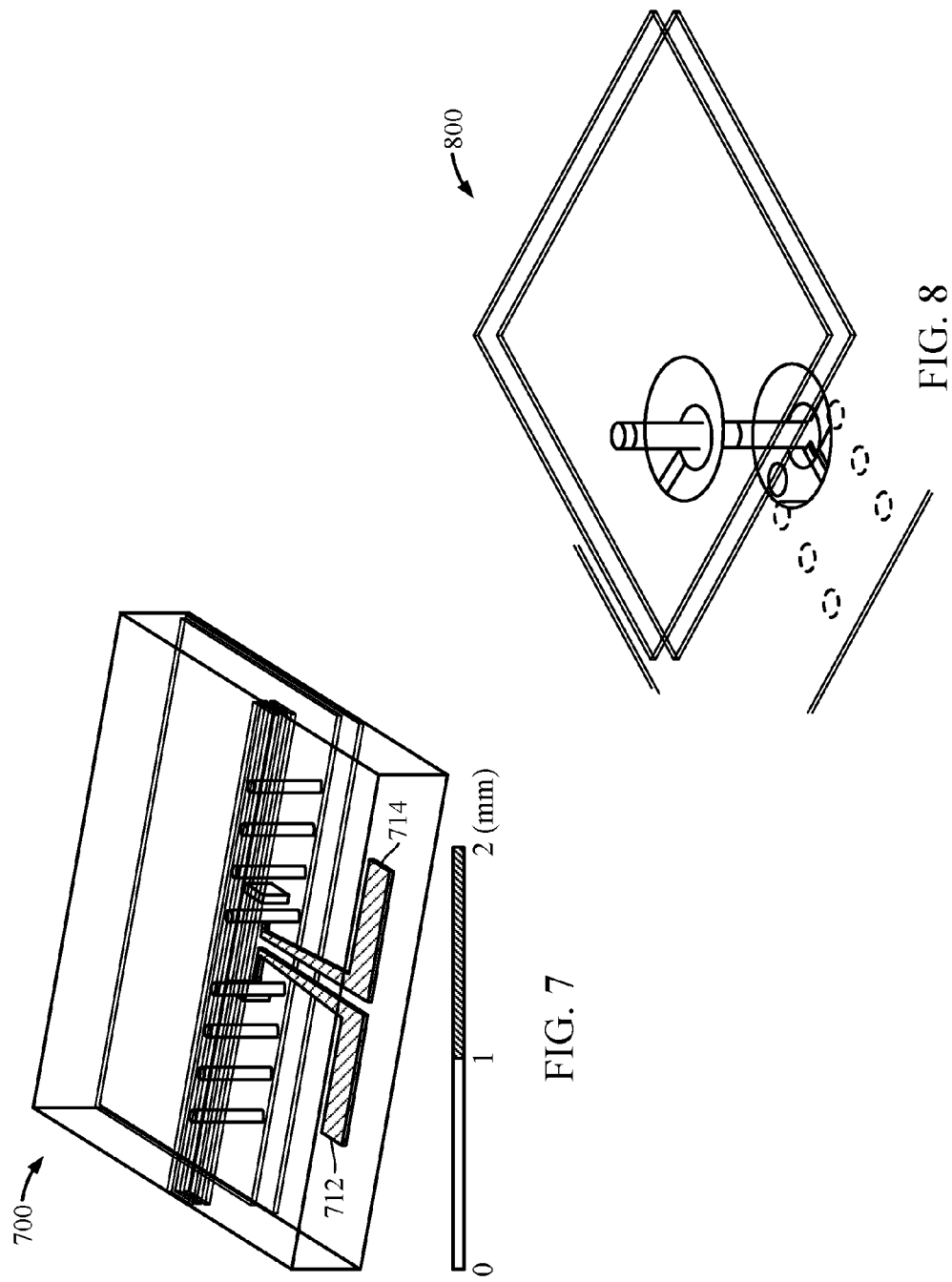
FIGS. 7 and 8 illustrate examples of different types of antennas printed on a flexible PCB, in accordance with certain aspects of the present disclosure.

FIG. 7 illustrates an example dipole antenna 700 for printing on a flexible PCB, in accordance with certain aspects of the present disclosure. The dipole antenna 700 includes a first antenna wing 712 and a second antenna wing 714 for propagating RF signals. The example dipole antenna 700 may be implemented on a flexible PCB for conveying DC, LO, IF, and control signals between a baseband module and an RF module as described with respect to FIG. 6.

FIG. 8 illustrates an example patch antenna 800 for printing on a flexible PCB, in accordance with certain aspects of the present disclosure. A patch antenna may include a flat sheet or 'patch' of conductive material, mounted over another sheet of conductive material which may be a ground plane. The two sheets together form a resonant piece of transmission line.

Figure 9:
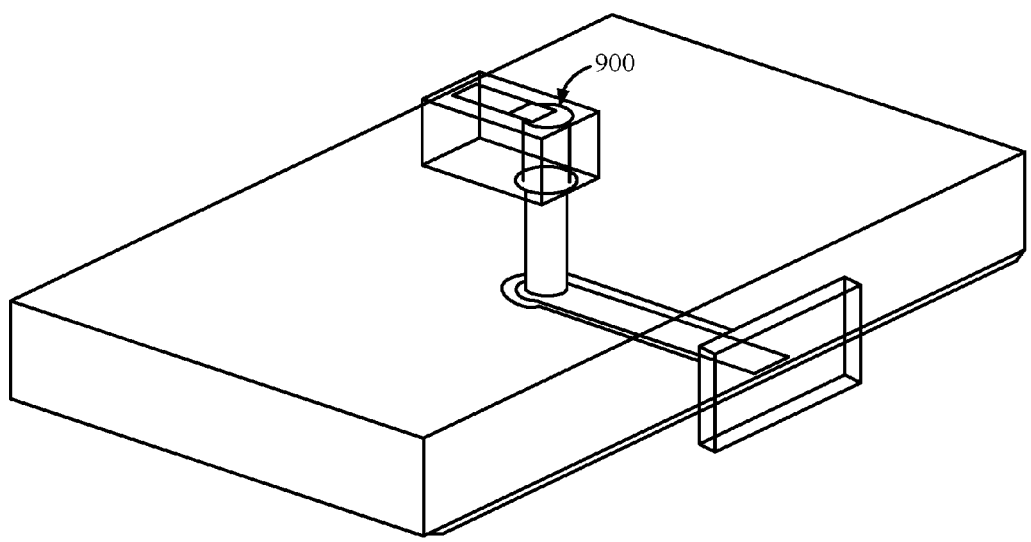
FIG. 9 illustrates an example of a surface mount form factor antenna mounted on a flexible PCB, in accordance with aspects of the present disclosure.

FIG. 9 illustrates an example antenna 900 having a SMT form factor, in accordance with certain aspects of the present disclosure. For example, the antenna 900 may be soldered to a flexible PCB, as described with respect to FIG. 6.

Figure 10:
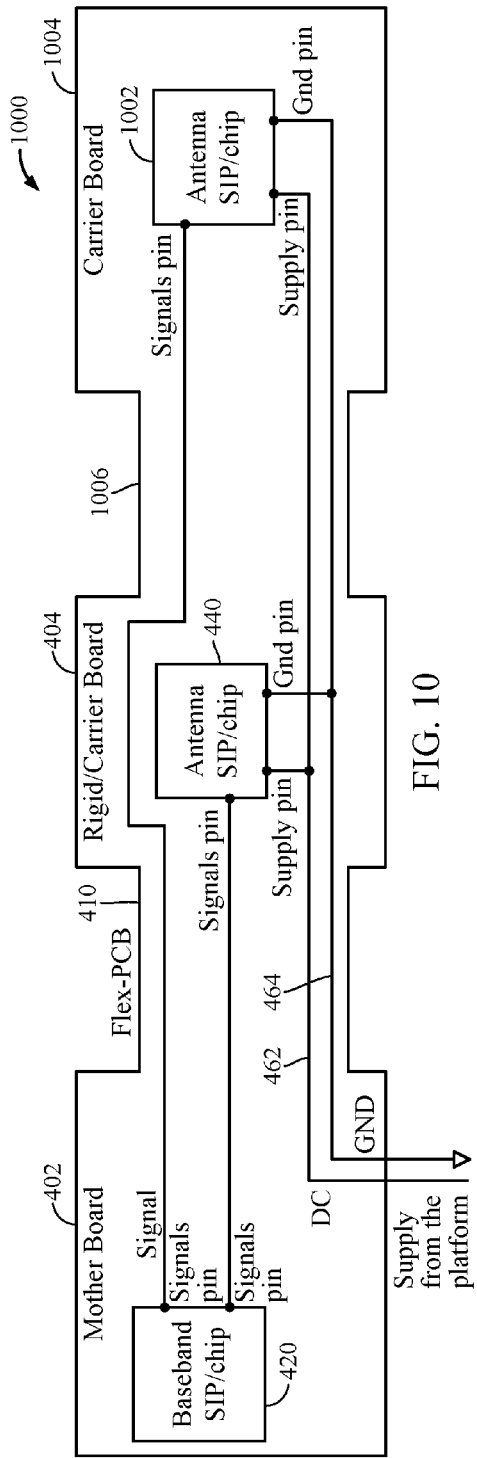
FIGS. 10 and 11 illustrate different example RF systems with multiple RF modules connected using a flexible PCB, in accordance with certain aspects of the present disclosure.

FIG. 10 illustrates an example RF system 1000 having multiple RF modules located on different carrier boards, in accordance with certain aspects of the present disclosure. For example, the RF system 1000 includes a first RF module 440 on a first carrier board 404 and a second RF module 1002 on a second carrier board 1004. The RF modules 440 and 1002 may be (daisy) chained together using one or multiple flexible PCBs. For example, a flexible PCB 1006 may be coupled between the carrier board 404 and the carrier board 1004. The baseband module 420 may provide LO, IF, and control signals to the RF module 1002 via the flexible PCB 1006. Moreover, the transmission lines 462 and 464 for the power signal and the reference potential (e.g., electric ground) may be provided from the motherboard 402 to the RF modules 440 and 1002 through the flexible PCBs 410 and 1006.

As described with respect to FIG. 6, one or more antennas may be coupled to the RF module 440 and disposed on the flexible PCB 410. In some cases, the one or more antennas coupled to the RF module 440 as described with respect to FIG. 6 may be disposed on the flexible PCB 1006 and/or the flexible PCB 410. In certain aspects, one or more antennas may be coupled to the RF module 1002 and disposed on the flexible PCB 1006 and/or flexible PCB 410.

Figure 11:
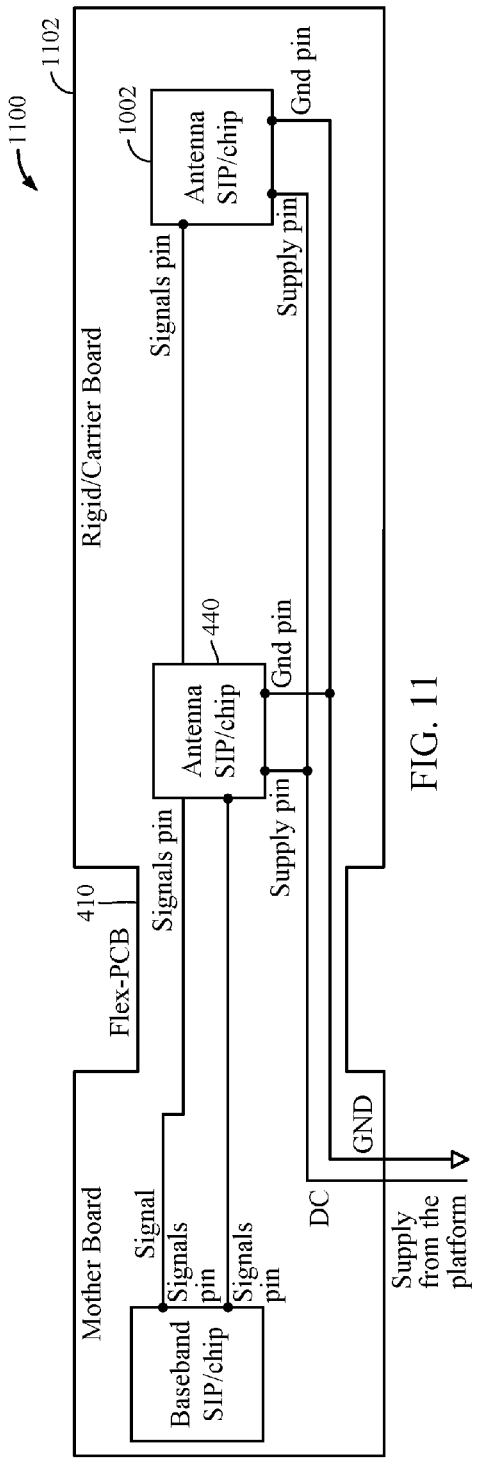

FIG. 11 illustrates an example RF system 1100 having multiple RF modules located on a single carrier board, in accordance with certain aspects of the present disclosure. For example, RF modules 440 and 1002 may be located on the same carrier board 1102 and coupled to the baseband module 420 using a single flexible PCB 410. Using multiple RF modules may allow, for example, for the use of diversity or high gain multi-module antenna arrays.

Use of the flexible PCB to connect baseband and RF modules, as described herein, may help reduce cost and complexity. For example, in some cases, use of a flexible PCB may allow for the removal of Bias-T circuit components from both sides of the PCB (e.g., the RF and baseband sides), thereby reducing both the bill of materials (BOM) and the size of packages.

Further, one alternative to having a low voltage drop during power delivery is to provide the power at a higher voltage and to up/down-convert on both sides of the transmission line. For example, the voltage of the power signal may be stepped up on the motherboard and subsequently stepped down on the carrier board. This approach may use extra components to convert and filter the power signal. Therefore, using the flexible PCB as described herein (that allows for lower voltages with less voltage drop) may also result in savings in both the size of the silicon die as well as package, by excluding those components. Still further, as described with reference to FIG. 6, using the flexible PCB as an antenna carrier may allow for more flexibility in placement and deployment of antenna arrays.

Figure 12:
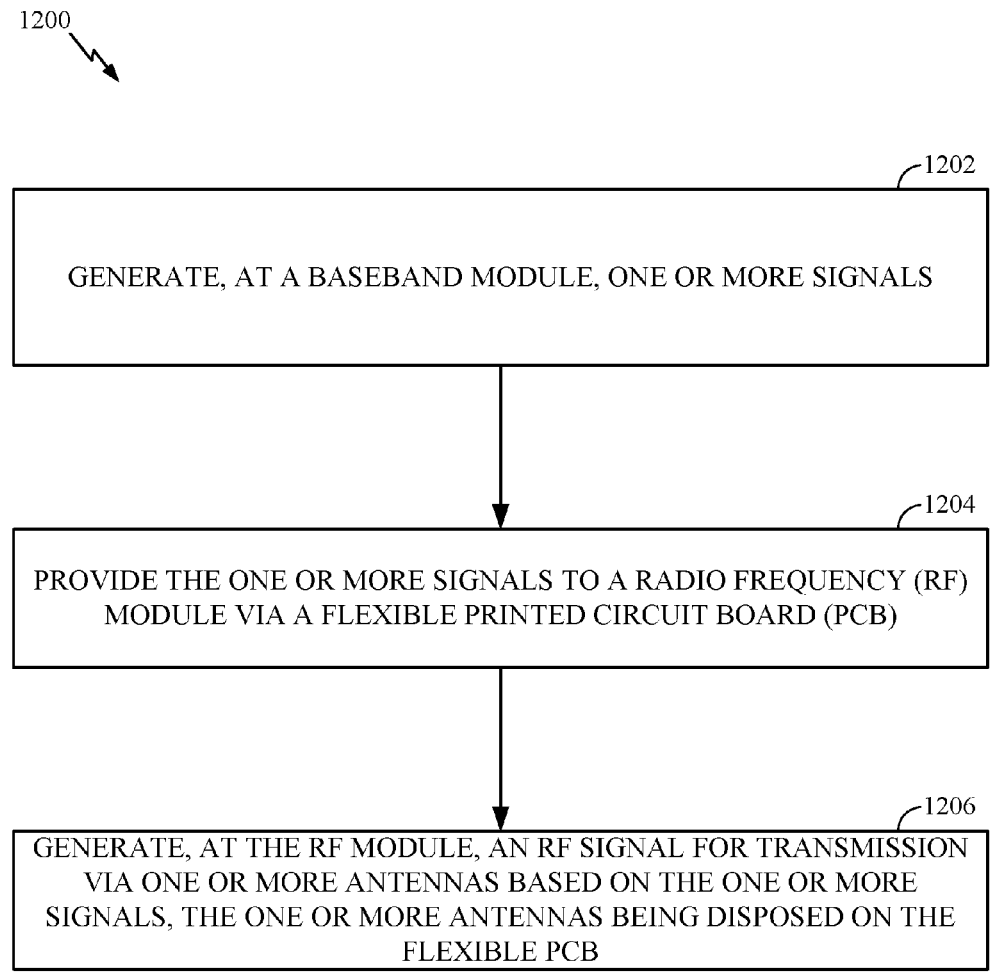
FIG. 12 illustrates example operations for transmitting an RF signal, in accordance with certain aspects of the present disclosure.

FIG. 12 illustrates example operations 1200 for wireless communication, in accordance with certain aspects of the present disclosure. The operations 1200 may be performed, for example, by a wireless device comprising a baseband module and an RF module, such as the baseband module 420 and RF module of FIG. 4.

Operations 1200 may begin, at block 1202, by generating, at a baseband module, one or more signals, and at block 1204, providing the one or more signals to a radio frequency (RF) module via a flexible printed circuit board (PCB). In certain aspects, at block 1206, the operations 1200 continue by generating, at the RF module, an RF signal for transmission via one or more antennas based on the one or more signals, the one or more antennas disposed on the flexible PCB.

In certain aspects, the operations 1200 also include generating, at the baseband module, one or more other signals, and providing the other signals to another RF module via the flexible printed circuit board (PCB). In some cases, the operations 1200 also include providing the other signals to the other RF module via the flexible PCB and another flexible PCB, and generating, at the other RF module, another RF signal for transmission via one or more other antennas disposed on the other flexible PCB. In this case, the RF module and the other RF module may be on separate boards.

Figure 13:
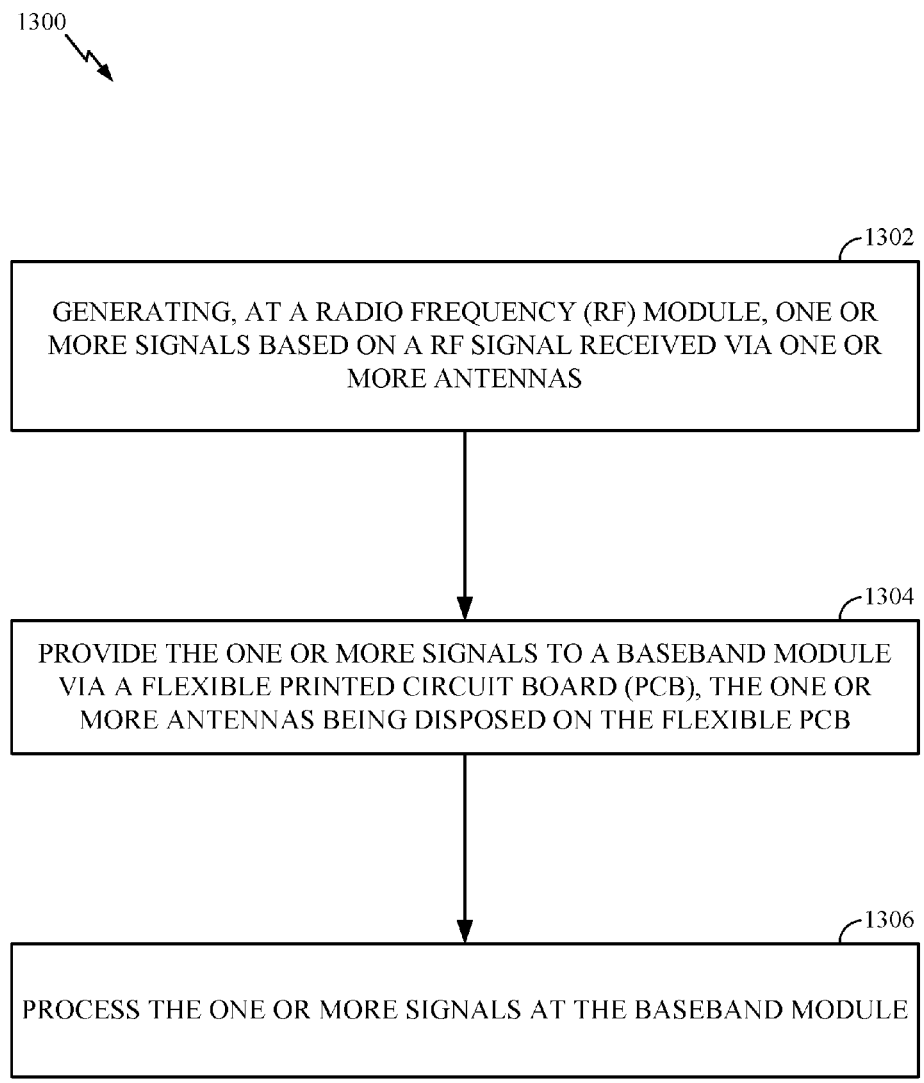
FIG. 13 illustrates example operations for receiving an RF signal, in accordance with certain aspects of the present disclosure.

FIG. 13 illustrates example operations 1300 for wireless communication, in accordance with certain aspects of the present disclosure. The operations 1300 may be performed, for example, by a wireless device comprising a baseband module and an RF module, such as the baseband module 420 and RF module of FIG. 4.

Operations 1300 may begin, at block 1302, by generating, at a RF module, one or more signals based on a RF signal received via one or more antennas, and at block 1304, providing the one or more signals to a baseband module via a flexible PCB, the one or more antennas disposed on the flexible PCB. In certain aspects, at block 1306, the operations 1300 continue by processing the one or more signals at the baseband module.

It is understood that the specific order or hierarchy of steps in the processes disclosed above is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

Moreover, the term "or" is intended to mean an inclusive "or" rather than an exclusive "or." That is, unless specified otherwise or clear from the context, the phrase, for example, "X employs A or B" is intended to mean any of the natural inclusive permutations. That is, for example the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. A phrase referring to "at least one of" a list of items refers to any combination of those items, including single members. As an example, "at least one of: a, b, or c" is intended to cover: a, b, c, a-b, a-c, b-c, and a-b-c.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus for wireless communication, comprising:
   one or more antennas;
   at least one carrier board;
   at least one radio frequency (RF) module disposed on the at least one carrier board and coupled to the one or more antennas;
   a mother board;
   a baseband module disposed on the mother board; and
   a flexible printed circuit board (PCB) coupled between the at least one carrier board and the mother board, the one or more antennas being disposed on the flexible PCB.

2. The apparatus of claim 1, wherein the at least one RF module comprises a first RF module and a second RF module, the apparatus further comprising:
   another flexible PCB coupled between the first RF module and the second RF module, wherein at least one of the one or more antennas are disposed on the other flexible PCB.

3. The apparatus of claim 1, wherein at least one of the one or more antennas is printed onto the flexible PCB.

4. The apparatus of claim 3, wherein the at least one of the one or more antennas printed onto the flexible PCB comprises at least one of a dipole antenna or a patch antenna.

5. The apparatus of claim 1, wherein at least one of the one or more antennas is printed onto a rigid portion of the flexible PCB.

6. The apparatus of claim 1, wherein at least one of the one or more antennas is soldered onto the flexible PCB.

7. The apparatus of claim 6, wherein the at least one of the one or more antennas soldered onto the flexible PCB is in a form factor of surface-mount technology (SMT) components.

8. The apparatus of claim 1, wherein:
   the at least one RF module is configured to process an RF signal received via the one or more antennas and generate a first intermediate frequency (IF) signal;
   the baseband module is configured to process the first IF signal and generate at least a first local oscillator (LO) signal and a first control signal; and
   the flexible PCB comprises at least one first transmission line configured to provide at least the first IF signal from the RF module to the baseband module and configured to provide at least the first LO signal and the first control signal from the baseband module to the RF module.

9. The apparatus of claim 8, wherein:
   the baseband module is configured to generate a second IF signal; and
   the at least one RF module is configured to receive the second IF signal via the flexible PCB and process the second IF signal to generate another RF signal for transmission.

10. The apparatus of claim 8, wherein the RF signal has a frequency component in a 60 GHz frequency band.

11. The apparatus of claim 8, wherein:
the at least one RF module comprises a first RF module and a second RF module;
the first transmission line is configured to provide the first IF signal from the first RF module to the baseband module; and
the flexible PCB comprises at least one second transmission line configured to provide at least a second IF signal from the second RF module to the baseband module and configured to provide at least a second LO signal and a second control signal from the baseband module to the second RF module.

12. The apparatus of claim 11, wherein the first RF module and the second RF module are located on a single PCB.

13. The apparatus of claim 11, wherein:
the first RF module is located on a first PCB and the second RF module is located on a second PCB, the first PCB and the second PCB being connected by another flexible PCB having at least one third transmission line configured to provide the at least the second LO signal and the second control signal from the first PCB to the second RF module.

14. The apparatus of claim 1, wherein the RF module is fabricated as a single RF integrated circuit (RFIC).

15. The apparatus of claim 1, wherein the flexible PCB comprises at least one transmission line configured to provide a power signal to the RF module.

16. The apparatus of claim 1, wherein the flexible PCB comprises one or more transmission lines configured to provide one or more sensor signals from the baseband module to the RF module.

17. The apparatus of claim 1, wherein the apparatus comprises a laptop computer, a tablet computer, or a mobile phone.

18. An apparatus for wireless communication, comprising:
one or more antennas;
a mother board;
a baseband module disposed on the mother board; and
a flexible printed circuit board (PCB) coupled to the mother board, wherein the flexible PCB is configured to provide one or more signals from the baseband module disposed on the mother board to at least one RF module disposed on at least one carrier board, the one or more antennas being disposed on the flexible PCB.

19. The apparatus of claim 18, wherein:
the baseband module is configured to generate a multiplexed signal based on at least one of an intermediate frequency (IF) signal, a local oscillator (LO) signal, or a control signal;
the flexible PCB comprises at least one first transmission line configured to provide the multiplexed signal to a radio frequency (RF) module; and
the one or more antennas are configured to transmit an RF signal generated using the multiplexed signal.

20. The apparatus of claim 18, wherein at least one of the one or more antennas is printed onto the flexible PCB.

21. The apparatus of claim 18, wherein at least one of the one or more antennas comprises at least one of a dipole antenna or a patch antenna.

22. The apparatus of claim 18, wherein at least one of the one or more antennas is soldered onto the flexible PCB, and is in a form factor of surface-mount technology (SMT) components.

23. The apparatus of claim 18, wherein the flexible PCB is configured to provide a power signal to a radio frequency (RF) module.

24. An apparatus for wireless communication, comprising:
one or more antennas;
at least one radio frequency (RF) module coupled to the one or more antennas;
a flexible printed circuit board (PCB) coupled to the RF module, the one or more antennas being disposed on the flexible PCB, wherein the at least one RF module comprises a first RF module and a second RF module; and
another flexible PCB coupled between the first RF module and the second RF module, wherein at least one of the one or more antennas is disposed on the other flexible PCB.

25. The apparatus of claim 24, wherein:
the at least one RF module is configured to receive a multiplexed signal based on at least one of a first intermediate frequency (IF) signal, a first local oscillator (LO) signal, or a first control signal; and
the flexible PCB comprises at least one first transmission line configured to provide the multiplexed signal to the at least one RF module.

26. The apparatus of claim 25, wherein:
the first transmission line is configured to provide the multiplexed signal to the first RF module; and
the flexible PCB comprises at least one second transmission line configured to provide a second multiplexed signal to the second RF module, the second multiplexed signal generated based on at least one of a second IF signal, a second LO signal, or a second control signal.

27. A method for wireless communication, comprising:
generating, at a baseband module, one or more signals;
providing the one or more signals to a radio frequency (RF) module via a flexible printed circuit board (PCB);
generating, at the RF module, an RF signal for transmission via one or more antennas based on the one or more signals, the one or more antennas being disposed on the flexible PCB;
generating, at the baseband module, one or more other signals;
providing the other signals to another RF module via the flexible printed circuit board (PCB);
providing the other signals to the other RF module via the flexible PCB and another flexible PCB; and
generating, at the other RF module, another RF signal for transmission via one or more other antennas disposed on the other flexible PCB, wherein the RF module and the other RF module are on separate boards.

28. An apparatus for wireless communication, comprising:
a plurality of antennas;
first circuitry at least partially configured to process radio frequency (RF) signals, the first circuitry coupled to one or more of the plurality of antennas;
second circuitry at least partially configured to process baseband signals; and
a flexible printed circuit coupled between the first circuitry and the second circuitry, at least one of the plurality of antennas being disposed on the flexible printed circuit.

29. The apparatus of claim 28, wherein at least one of the plurality of antennas is printed on a localized rigid section of the flexible printed circuit.

30. The apparatus of claim 28, wherein the first circuitry is disposed on a carrier board.

\* \* \* \* \*